United States Patent [19]

Adachi

[11] Patent Number: 5,903,193
[45] Date of Patent: May 11, 1999

[54] AMPLIFYING DEVICE AND TRANSMISSION OUTPUT CONTROL APPARATUS

[75] Inventor: Keigo Adachi, Tokyo, Japan

[73] Assignee: Mitsubishi Denki Kabushiki Kaisha, Tokyo, Japan

[21] Appl. No.: 08/902,103

[22] Filed: Jul. 29, 1997

[30] Foreign Application Priority Data

Jan. 30, 1997  [JP]  Japan ................................. 9-016846

[51] Int. Cl.⁶ ........................................................ H03F 3/30
[52] U.S. Cl. ........................................... 330/279; 330/285
[58] Field of Search ........................... 330/51, 133, 279, 330/285, 297, 298, 207 P

[56] References Cited

U.S. PATENT DOCUMENTS

| | | | |
|---|---|---|---|
| 5,083,096 | 1/1992 | Miyazaki | 330/285 |
| 5,086,508 | 2/1992 | Furuno | 455/69 |
| 5,648,742 | 7/1997 | Ghaffaripour | 330/51 |
| 5,663,681 | 9/1997 | Botti et al. | 330/51 |
| 5,752,171 | 5/1998 | Akiya | 330/279 |

*Primary Examiner*—Robert Pascal
*Assistant Examiner*—Khanh Van Nguyen
*Attorney, Agent, or Firm*—Pothwell, Figg, Ernst & Kurz

[57] ABSTRACT

A second drain voltage switch is provided to turn ON/OFF a drain voltage in an amplifier in the final stage, the drain voltage in the amplifier in the final stage is turned ON when large output power is required, and the drain voltage in the amplifier in the final stage is turned OFF when small output power is required, thus a transmission output control apparatus capable of controlling output power in a wide range being obtained.

8 Claims, 5 Drawing Sheets

M-ES NOMINAL ERP LEVELS FOR M-ES DEVICE CLASSES

| LEVEL | CLASS 1 | CLASS 2 | CLASS 3 | CLASS 4 |
|---|---|---|---|---|
| 0 | 6dBW | 2dBW | -2dBW | -2dBW |
| 1 | 2dBW | 2dBW | -2dBW | -2dBW |
| 2 | -2dBW | -2dBW | -2dBW | -2dBW |
| 3 | -6dBW | -6dBW | -6dBW | -6dBW |
| 4 | -10dBW | -10dBW | -10dBW | -10dBW |
| 5 | -14dBW | -14dBW | -14dBW | -14dBW |
| 6 | -18dBW | -18dBW | -18dBW | -18dBW |
| 7 | -22dBW | -22dBW | -22dBW | -22dBW |
| 8 | -22dBW | -22dBW | -22dBW | -26dBW±3dB |
| 9 | -22dBW | -22dBW | -22dBW | -30dBW±6dB |
| 10 | -22dBW | -22dBW | -22dBW | -34dBW±6dB |

THE TRANSMISSION POWER LEVEL SHALL BE LESS THAN +2dB AND GREATER THAN -4dB FROM THE MAXIMUM OUTPUT POWER VALUE FOR EACH DISTINCT TRANSMISSION POWER LEVEL.

FIG.2

AMPLIFYING DEVICE AND TRANSMISSION OUTPUT CONTROL APPARATUS

FIELD OF THE INVENTION

The present invention relates to an amplifying device having a plurality units of amplifying means as well as to a transmission output control apparatus, and more particularly to a transmission output control apparatus used for a mobile information communication terminal or the like.

BACKGROUND OF THE INVENTION

FIG. 5 is a block diagram showing a transmission output control apparatus having a conventional type of amplifying device.

In FIG. 5, the reference numeral 1 indicates an input terminal to which a transmitter signal to the transmission output control apparatus is inputted, and the reference numeral 2 indicates an amplifier circuit in an exciting stage for amplifying the signal inputted into this input terminal 1. The reference numeral 3 is an amplifier circuit in a final stage for receiving a signal outputted from the amplifier circuit 2 in the exciting stage and amplifying power of the signal, said amplifier circuit comprising a FET (field effect transistor). The reference numeral 4 is an output terminal for taking out transmission output with the power amplified in an amplifier circuit 3 in the final stage.

The reference numeral 5 indicates a power supply terminal for supplying a drain voltage to the FET in the amplifier circuit 3 in the final stage, and the reference numeral 6 indicates a drain voltage switching means for switching a drain voltage supplied from the power supply terminal 5 to the FET in the amplifier circuit 3 in the final stage.

The reference numeral 7 is a coupler for taking out output from the amplifier circuit 3 in the final stage branching a portion thereof, and the reference numeral 8 indicates a detector circuit for detecting a signal taken out in the coupler 7 and outputting a signal corresponding to an output power from the amplifier circuit 3 in the final stage. The reference numeral 9 is a control means for generating a signal for specifying output power from the amplifier circuit 3 in the final stage, and this control means also controls the drain voltage switching means 6.

The reference numeral 10 is a power control circuit for generating a control signal for controlling output from the amplifier circuit 2 in the exciting stage according to a signal outputted from the detector circuit 8 as well as to the output power select signal generated in the control means 9. The reference numeral 11 is a power control transistor for controlling output from the amplifier circuit 2 in the exciting stage according to a control signal from the power control circuit 10.

Next description is made of the operation of the circuit.

At first, a control signal for controlling the drain voltage switching means 6 is outputted from the control means 9. When this control signal is at a low level, a switching transistor in the drain voltage switching means 6 is energized. In this case, the drain voltage from the power supply terminal 5 is supplied to a drain terminal of the FET in the amplifier circuit 3 in the final stage. With this, operation of the amplifier circuit 3 in the final stage is started, and power of an input signal from the input terminal 1 amplified in the amplifier circuit 2 in the exciting stage is amplified with the signal outputted from the outputted terminal 4 through the coupler 7.

On the other hand, a portion of the output from the amplifier circuit 3 in the final stage is branched by the coupler 7 and is inputted into the detector circuit 8. The detector circuit 8 detects a portion of the output from the amplifier circuit 3 in the final stage branched by the coupler 7 and generates a signal corresponding to output power from the amplifier circuit 3 in the final stage. The power control circuit 10 compares an output power select signal generated by the control means 9 to the signal corresponding to output power from the amplifier circuit 3 in the final stage which is generated in the detector circuit 8, generates a control signal so that the output power from the amplifier circuit 3 in the final stage is equalized to the power selected according to the output power select signal generated in the control means 9, and sends the signal to the power control transistor 11.

The power control transistor 11 controls a voltage loaded to the amplifier circuit 2 in the exciting stage according to a control signal generated in the power control circuit 10 and provides controls so that the output power from the amplifier circuit in the final stage is equalized to and maintained at the same level as the power selected according to the output power select signal generated in the control means 9.

Configuration of an amplifier apparatus based on the conventional technology is as described above, so that a voltage is always loaded to a drain terminal of the FET in the amplifier circuit 3 in the final stage. Generally, in a case where a drain voltage is loaded to an amplifying means such as an FET or an NPN transistor, isolation between the gate and drain becomes poorer, and sometimes power inputted to the gate terminal may be leaked to the drain terminal. For this reason, in a case where low output power is required such as when it is required that output power from an amplifying device is smaller than input power thereto, even if a voltage loaded to the amplifier 2 in the exciting stage is controlled, the power inputted into the gate terminal is leaked to the drain terminal and is added to the output power therefrom because of the characteristics of the amplifying means as described above. For this reason, even if lower output power is required, sometimes it may be impossible to suppress the output power to a certain level or below.

SUMMARY OF THE INVENTION

It is an object of the present invention to obtain an amplifying device and a transmission output power control unit which can control output power in a wide range.

The amplifying device according to the first feature of the present invention comprises the first amplifying means for amplifying an inputted signal and outputting the amplified signal, the second amplifying means for amplifying an inputted signal and outputting the amplified signal, the power supply unit for supplying power to the first amplifying means and to the second amplifying means, the switching means for controlling power supply from the power supply unit to the first amplifying means as well as to the second amplifying means according to a control signal, and the control means for outputting a control signal for controlling the switching means, to the switching means, so that power is supplied to the first amplifying means with power supply to the second amplifying means suppressed in low amplification and also power is supplied to both the first and second amplifying means in high amplification, and for this reason, especially when lower output power is required, the output power can be suppressed to a certain level or below and can also be controlled in a wide range.

In the amplifying device according to the second feature of the present invention, the control means further generates a power select signal for specifying power of an output signal from the amplifying device, the switching means further controls power supply to the first amplifying means according to a power control signal, and the amplifying device further comprises the detecting means for detecting a signal corresponding to power of an output signal from the amplifying device and a power control means for generating a power control signal for controlling power of an output signal from the amplifying device according to a signal detected by the detecting means as well as to the power select signal and outputting the power select signal to the switching means, so that the output power can further be stabilized in addition to the effect achieved in the first feature of the present invention.

In the amplifying device according to the third feature of the present invention, the control means outputs, when output from the amplifying device is to be suppressed, a power control signal for suppressing the output to the power control means, so that it is not required to further discretely provide therein a switching means for suppressing power from the power supply unit to the first amplifying means, which makes it possible to reduce a circuit scale.

In the amplifying device according to the fourth feature of the present invention, the switching means comprises the first switching means for controlling power supply to the first amplifying means according to the power control signal outputted from the power control means and the second switching means for controlling power supply from the power supply unit to the second amplifying means, so that the output power can further be stabilized like in the effect obtained in the second feature of the present invention.

In the amplifying device according to the fifth feature of the present invention, the switching means comprises the second switching means for controlling power supply from the power supply unit to the second amplifying means and the third switching means for controlling power supply from the power supply unit to the first amplifying means as well as to the second amplifying means, so that, like the effect obtained in the first feature, especially when lower output power is required, the output power can be suppressed to a certain level or below and can also be controlled in a wide range.

In the amplifying device according to the sixth feature of the present invention, the control means outputs a control signal for controlling power to the second amplifying means to an arbitrary value, so that output power can be controlled with higher precision.

In the amplifying device according to the seventh feature of the present invention, the second amplifying means comprises a field effect transistor, so that it is possible to prevent such phenomenon as that power inputted especially to the gate terminal is leaked to the drain terminal.

In the amplifying device according to the eighth feature of the present invention, an input signal to the amplifying device is inputted into the first amplifying means, and a signal outputted from the first amplifying means is inputted into the second amplifying means, so that it is possible to prevent increase of output power in the amplifying means in the final stage.

The transmission output control apparatus according to the ninth feature of the present invention comprises the amplifying device, and an input signal to the amplifying device is a transmission signal, so that, especially when lower output power is required, the output power can be suppressed to a certain level or below and can also be controlled in a wide range.

Other objects and features of this invention will become understood from the following description with reference to the accompanying drawings.

BRIEF DESCRIPTION OF THE DRAWINGS

FIG. 2 is a view showing transmission output power from a mobile information communication terminal according to Embodiment 2 of the present invention;

DESCRIPTION OF THE PREFERRED EMBODIMENTS

Description is made hereinafter for Embodiment 1 of the present invention with reference to the related drawings. In Embodiment 1, description is made especially for a case where the amplifying device according to the present invention is applied to a transmission output control apparatus.

Figure 1:
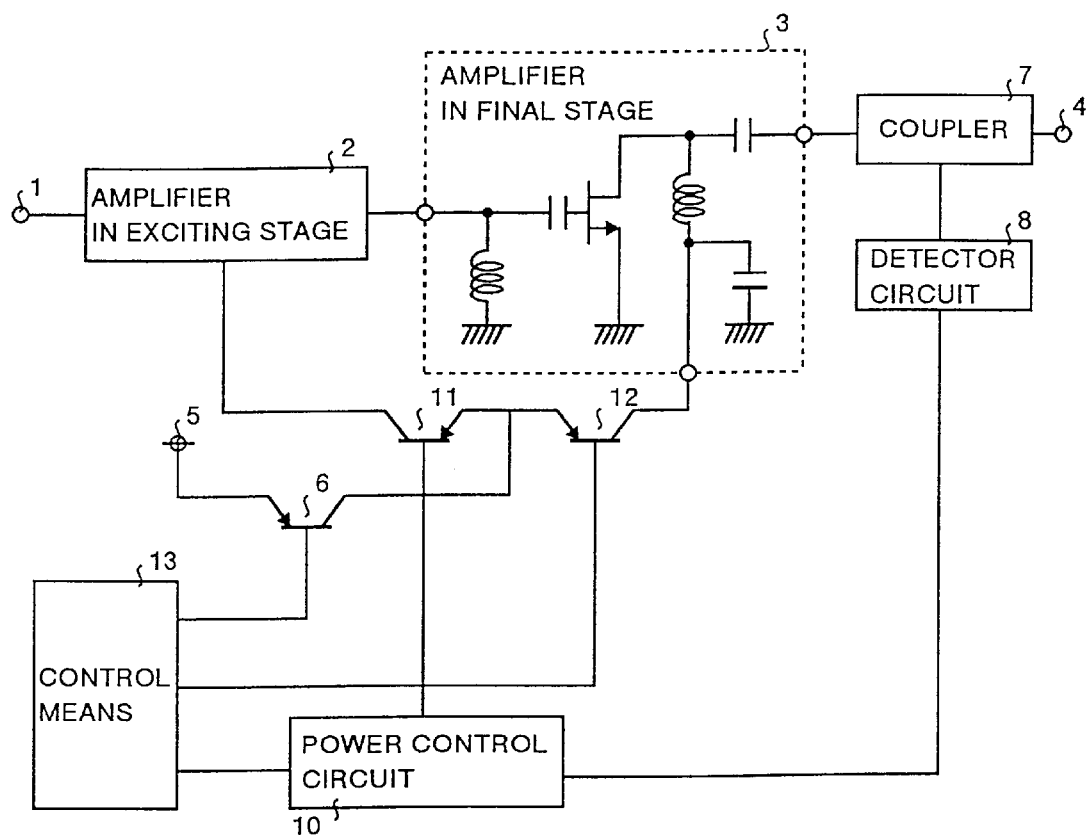
FIG. 1 is a block diagram showing configuration of a transmission output control apparatus according to Embodiment 1 of the present invention.

In FIG. 1, designated at the reference numeral 1 is an input terminal, at 2 an amplifier circuit in an exciting stage, at 3 an amplifier circuit in a final stage comprising a FET, at 4 an output terminal, at 5 a power supply terminal, at 6 a drain voltage switching means, at 7 a coupler, at 8 a detector circuit, at 10 a power control circuit, and at 11 a power control transistor, and the same reference numerals are assigned to the same sections corresponding to those in the conventional type of amplifying device.

The reference numeral 12 indicates a second drain voltage switching means for switching a drain voltage loaded to the amplifier 3 in the final stage from the power supply terminal 5 through the drain voltage switching means 6. The reference numeral 13 indicates a control means corresponding to the conventional type of control means 9 and the control means 13 also generates a control signal for the second drain voltage switching means 12 in addition to the output power select signal as the first control signal and a control signal of the drain voltage switching means as the second control.

Herein, in Embodiment 1, the amplifier circuit 2 in the exciting stage corresponds to a first amplifying means according to the present invention, the amplifier circuit 3 in the final stage to a second amplifying means according to the present invention, and the drain voltage switching means 6 as well as the second drain switching means 12 to a switching means according to the present invention. Also, the coupler 7 and detector circuit 8 correspond to a detecting means according to the present invention.

Next description is made of the operation of the circuit.

A transmitter signal inputted from the input terminal is basically outputted to the amplifier 3 in the final stage after the signal is inputted to the amplifier 2 in the exciting stage and is amplified. The amplifier 3 in the final stage amplifies the signal received from the amplifier 2 in the exciting stage and outputs the amplified signal to the output terminal 4.

Next description is made for a case where the transmission output power of a transmitter signal outputted from the output terminal 4 is to be suppressed to a low level.

In this case, a control signal outputted from the control means 13 for controlling the drain voltage switching means 6 is set to a low level, while a control signal for controlling the second drain voltage switching means 12 is set to a high level. With these control signals, the drain voltage switching means 6 is energized, while the second drain voltage switching means 12 is electrically disconnected. With this feature, a voltage is not supplied to a drain terminal of the FET in the amplifier 3 in the final stage, but a voltage is supplied from the power supply terminal 5 only to the amplifier 2 in the exciting stage through the power control transistor 11.

The transmitter signal inputted from the input terminal 1 is inputted to the amplifier 3 in the final stage amplified by the amplifier 2 in the exciting stage. Herein, a voltage is not loaded to the drain terminal of the FET in the amplifier 3 in the final stage, so that the drain terminal is opened and the inputted transmitter signal is attenuated due to junction resistance of the FET between the gate and the drain, and the attenuated signal is outputted.

An output signal outputted from the amplifier 3 in the final stage is outputted from the output terminal 4 through the coupler 7. A portion of the output from the amplifier 3 in the final stage is branched by the coupler 7 and inputted into the detector circuit 8. The detector circuit 8 detects a portion of the output from the amplifier 3 in the final stage branched by the coupler 7, and generates a signal corresponding to output power from the amplifier 3 in the final stage. The power control circuit 10 compares an output power select signal generated by the control means 13 to a signal corresponding to output power from the amplifier 3 in the final stage generated in the detector circuit 8, generates a control signal so that the output power from the amplifier 3 in the final stage is equalized to the same level as the power selected according to the output power select signal generated in the control means 13, and sends the signal to the power control transistor 11. The power control transistor 11 controls a voltage loaded to the amplifier 2 in the exciting stage according to the control signal generated by the power control circuit 10 so that the output power from the amplifier 3 in the final stage is equalized to and maintained at the same level as the power selected according to the output power select signal generated in the control means 13.

Next description is made for a case where transmission output power is set to a higher level.

In this case, both a control signal for controlling the drain voltage switching means 6 and a control signal for controlling the second drain voltage switching means 12 each outputted from the control means 13 are set to a low level. In this operation, both the drain voltage switching means 6 and second drain voltage switching means 12 are energized, and a transmitter signal inputted from the input terminal 1 is amplified by the amplifier 2 in the exciting stage and further is amplified by the amplifier 3 in the final stage to be outputted from the output terminal through the coupler 7.

It should be noted that the apparatus according to Embodiment 1 has the configuration in which power to the amplifier 2 in the exciting stage is controlled by the power control circuit 10 and that to the amplifier 3 in the final stage is controlled by the control means 13, but conversely the apparatus according to Embodiment 1 may have the configuration in which power to the amplifier 3 in the final stage is controlled by the power control circuit 10 and that to the amplifier 2 in the exciting stage is controlled by the control means 13.

As described above, the amplifying device according to Embodiment 1 of the present invention comprises a first amplifying means for amplifying an inputted signal and outputting the amplified signal, a second amplifying means for amplifying an inputted signal and outputting the amplified signal, a power supply unit for supplying power to the first amplifying means and to the second amplifying means, a switching means for controlling the power supplied from the power supply unit to the first amplifying means as well as to the second amplifying means according to a control signal, and a control means for outputting a control signal for controlling the switching means, to the switching means, so that power is supplied to the first amplifying means with the power supply to the second amplifying means suppressed in low amplification and also power is supplied to both the first and second amplifying means in high amplification, and for this reason, especially when low output power is required, the output power can be suppressed to a certain level or below and can be controlled in a wide range.

Furthermore, the control means further generates a power select signal for specifying power of an output signal from the amplifying device, the switching means further controls power supply to the first amplifying means according to a power control signal, and the amplifying device further comprises a detecting means for detecting a signal corresponding to power of an output signal from the amplifying device and a power control means for generating a power control signal for controlling power of an output signal from the amplifying device according to a signal detected by the detecting means as well as to the power select signal and outputting the power control signal to the switching means, so that the output power can further be stabilized.

In Embodiment 2, description is made for a case where the amplifying device and the transmission output control apparatus according to the present invention are applied to a mobile information communication terminal specified in North American mobile information communication system—Cellular Digital Packet Data Release 1.1 (described as CDPD hereinafter).

FIG. 2 is a view showing transmission output power of the mobile information communication terminal specified in the CDPD. In the CDPD as shown in the figure, types of the mobile information communication terminal are classified into Classes 1 to 4 according to a level of the transmission output power.

Figure 3:
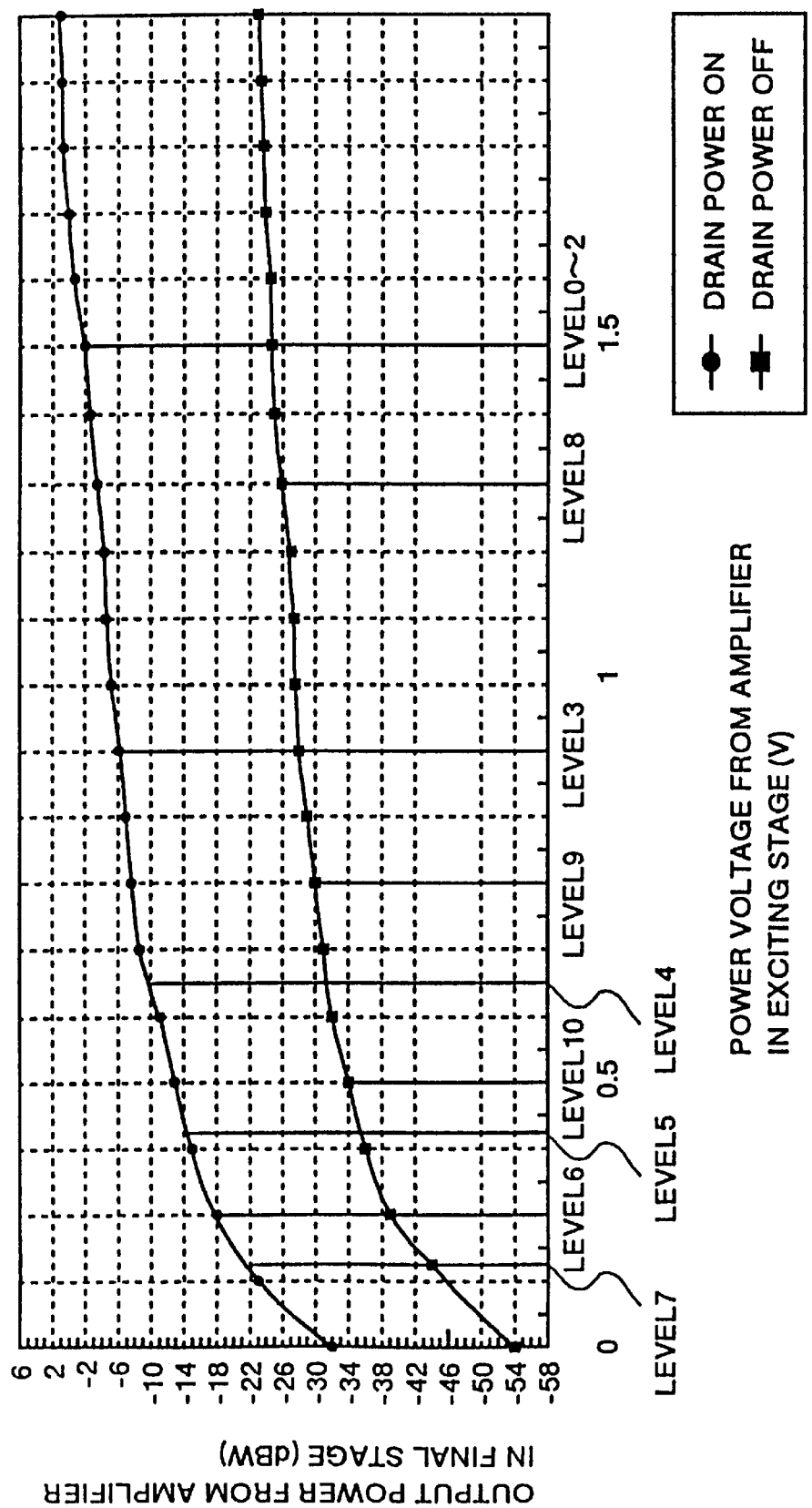
FIG. 3 is an example of information obtained by actually measuring output power from the transmission output control apparatus according to Embodiment 2 of the present invention.

FIG. 3 is a view showing an example of information obtained by actually measuring output power from the amplifier 3 in the final stage to a power voltage (a voltage of the collector in the power control transistor 11) of the amplifier 2 in the exciting stage in the transmission output control apparatus to which one of Embodiments of the present invention is applied.

Description is made for a case where the transmission output control apparatus with the characteristics as shown in FIG. 3 is applied to the specification of Class 4 shown in FIG. 2. For instance, when a signal is to be transmitted with output power at LEVEL 0, a signal for controlling the second drain voltage switching means 12 outputted from the control means 13 is set to a low level, and a voltage is loaded to the drain terminal of the FET in the amplifier 3 in the final stage, whereby the amplifier 3 in the final stage is operated. And at the same time, if an output power select signal generated by the control means 13 is selected so that a collector voltage of the power control transistor 11 is 1.5 V, output power of −2 dBW can be obtained.

Then, when a signal is to be transmitted in output power of LEVEL 8, a signal for controlling the second drain voltage switching means 12 outputted from the control means 13 is set to a high level so that a voltage is not supplied to the drain terminal of the FET in the amplifier 3 in the final stage. If an output power select signal generated by the control means 13 is selected so that a collector voltage of the power control transistor 11 is 1.3 V, output power of −26 dBW can be obtained. Similarly, if a voltage is supplied to the drain terminal of the FET in the amplifier 3 in the final stage in a range from LEVELS 1 to 7 and a voltage is not supplied to the drain terminal of the FET in the amplifier 3 in the final stage in a range from LEVELS 9 to 10, output power at all the levels can be obtained by appropriately selecting output power select signal generated by the control means 13.

As described above, a transmission output control apparatus with which output power can be controlled in a wide range can be obtained by providing the second drain voltage switching means 12 and controlling it by the control means 13.

Figure 4:
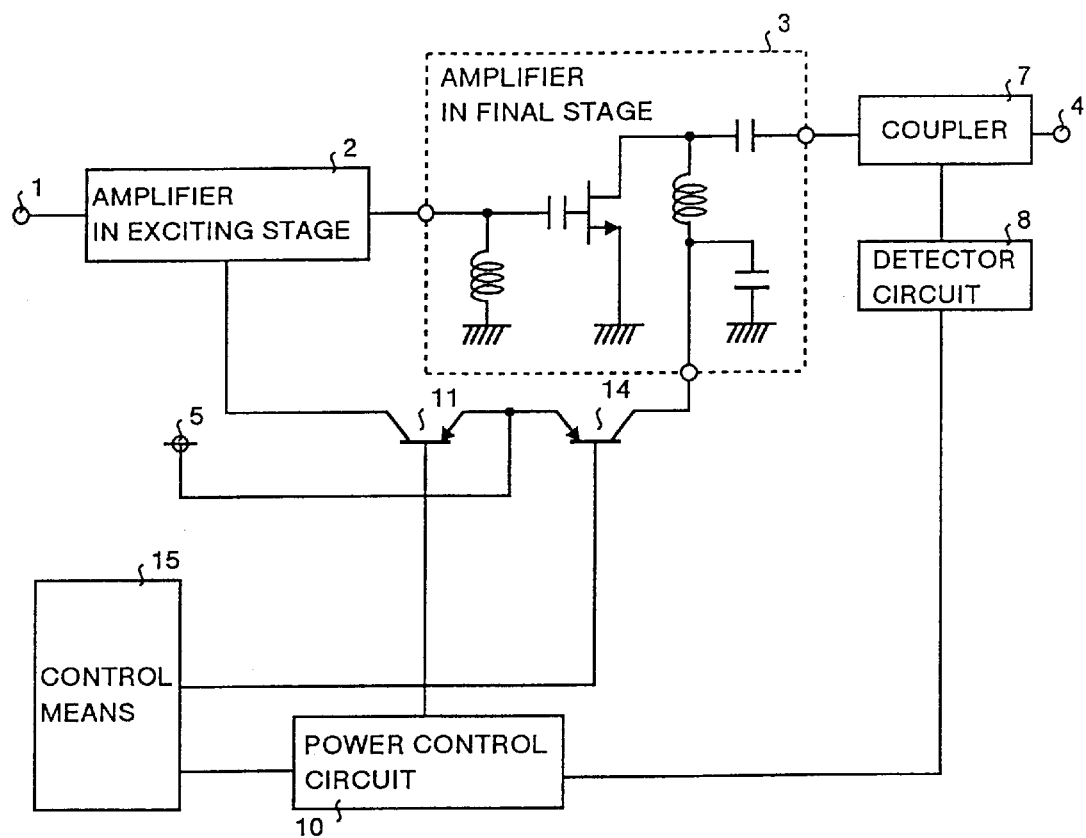
FIG. 4 is a block diagram showing a transmission output control apparatus according to Embodiment 3 of the present invention.
Figure 5:
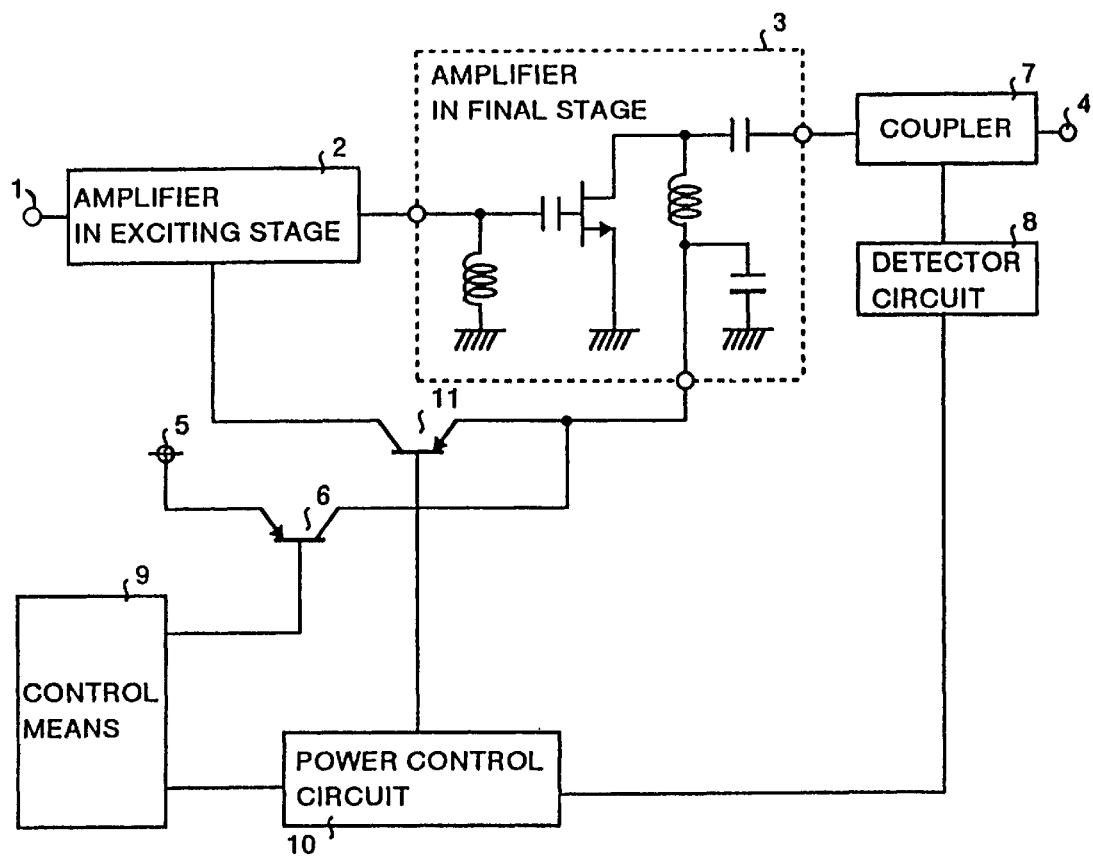
FIG. 5 is a block diagram showing a transmission output control apparatus based on the conventional technology.

FIG. 4 shows a transmission output control apparatus having an amplifying device according to Embodiment 3 of the present invention. In Embodiment 3, especially the drain voltage switching means 6 and the second drain voltage switching means 12 each according to Embodiment 1 are integrated into one unit.

In the figure, the reference numeral 14 indicates a drain voltage switching means in which the drain voltage switching means 6 and the second drain voltage switching means 12 each according to Embodiment 1 are integrated, and the reference numeral 15 indicates a control means corresponding to the control means 13 according to Embodiment 1 and the control means generates a control signal for the drain voltage switching means 14 in addition to an output power select signal which is the first control signal.

Description is made hereinafter for the related drawings.

When transmission output power is set to a high level, if a signal outputted from the control means 15 for controlling the drain voltage switching means 14 is to be set to a low level, the drain voltage switching means 14 is energized, and a transmitter signal inputted from the input terminal 1 is amplified by the amplifier 2 in the exciting stage and is amplified by the amplifier 3 in the final stage to be outputted from the output terminal through the coupler 7. When transmission output power thereof is set to a low level, if a signal outputted from the control means 15 for controlling the drain voltage switching means 14 is set to a higher level, the drain voltage switching means 14 is not energized, so that a transmitter signal inputted from the input terminal 1 is amplified by the amplifier 2 in the exciting stage, and is attenuated by the amplifier 3 in the final stage to be outputted from the output terminal through the coupler 7.

When transmission output is to be turned OFF, a transmission output select signal outputted from the control means 15 is sent so that a signal of a base terminal in the power control transistor 11 outputted from the power control circuit 10 is set to a high level, and if a signal for controlling the drain voltage switching means 14 is set to a high level, a voltage is not loaded to the amplifier 2 in the exciting stage as well as to the amplifier 3 in the final stage, so that the transmission output can be turned OFF.

In the amplifying device according to Embodiment 3, especially, the control means outputs, when output from the amplifying device is to be suppressed, a power control signal for suppressing the output to the power control means, so that it is not required to further discretely provide therein a switching means for suppressing power from the power supply unit to the first amplifying means, which makes it possible to reduce a circuit scale.

Although each of Embodiments 1 to 3 has the configuration in which the drain voltage switching means 14 is turned ON or OFF according to a signal from the control means 15, by setting the signal from the control means 15 to an appropriate value, a voltage loaded to the drain terminal of the FET in the amplifier 3 in the final stage can be controlled to an appropriate value, and any arbitrary amplification factor of the amplifier 3 in the final stage can be selected. By selecting any arbitrary amplification factor of the amplifier 3 in the final stage, output power can be controlled with higher precision.

In each of Embodiments as described above, an FET is used as an amplifying means, but an amplifying means according to the present invention is not restricted to the FET, and any amplifier such as an NPN transistor or the like is allowable so long as it has such characteristics that isolation between the gate and drain becomes poorer when a drain voltage is loaded thereto.

This application is based on Japanese patent application No. HEI 9-16846 filed in the Japanese Patent Office on Jan. 30, 1997, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An amplifying device comprising:
    a first amplifier for amplifying an inputted signal and outputting a first amplified signal;
    a second amplifier for amplifying said first amplified signal and outputting a second amplified signal;
    a power supply unit for supplying power to both said first amplifier and to said second amplifier;
    a feedback loop receiving said second amplified signal and comparing said second amplified signal to a reference signal, with said feedback loop generating a first control signal in a low amplification mode which varies as a result of the comparison of said second amplified signal with said reference signal;
    a controller for outputting said reference signal and generating a second control signal in a low amplification mode;
    a first switch, connected between said power supply unit and said first amplifier, receiving said first control signal and controlling the amount of said power to said first amplifier in a low amplification mode in accordance with said first control signal; and
    a second switch, connected between said power supply and said second amplifier, receiving said second control signal and turning off said power to said second amplifier in a low amplification mode.

2. An amplifying device according to claim 1; wherein said reference signal comprises a power select signal for specifying power for an output signal from said amplifying device;
    said first switch further controls power supply to said first amplifier according to a power control signal; and
    said amplifying device further comprises a detector for detecting a signal corresponding to power of an output signal from said amplifying device and a power controller for generating a power control signal for controlling power of an output signal from said amplifying device according to a signal detected by said detector as well as to said power select signal and outputting the power control signal to said switch.

3. An amplifying device according to claim 2; wherein said controller outputs, when output from said amplifying device is to be suppressed, a power control signal for suppressing the output to said power controller.

4. An amplifying device according to claim 1, further comprising a third switch for controlling power supply from said power supply unit to said first amplifier as well as to said second amplifier.

5. An amplifying device according to claim 1, wherein said controller outputs a control signal for controlling power to said second amplifier to an arbitrary value.

6. An amplifying device according to claim 1, wherein said second amplifier comprises a field effect transistor.

7. An amplifying device according to claim 1, wherein an input signal to said amplifying device is inputted into said first amplifier, and a signal outputted from said first amplifier is inputted into said second amplifier.

8. A transmission output control apparatus comprising the amplifying device according to claim 1, wherein an input signal to said amplifying device is a transmission signal.

* * * * *

UNITED STATES PATENT AND TRADEMARK OFFICE
CERTIFICATE OF CORRECTION

PATENT NO.   : 5,903,193
DATED        : May 11, 1999
INVENTOR(S)  : Keigo Adachi It is certified that error appears in the above-identified patent and that said Letters Patent is hereby corrected as shown below:

Title page, col. 2, the name of the Attorney, Agent, or Firm should be --Rothwell, Figg, Ernst & Kurz--;

Column 1, line 53, "circuit" should be --apparatus --.

Signed and Sealed this

Eleventh Day of January, 2000

Attest:

Q. TODD DICKINSON

*Attesting Officer*  *Acting Commissioner of Patents and Trademarks*